(12) United States Patent  
Post et al.

(10) Patent No.: US 6,210,771 B1  
(45) Date of Patent: Apr. 3, 2001

(54) ELECTRICALLY ACTIVE TEXTILES AND ARTICLES MADE THEREFROM

(75) Inventors: E. Rehmi Post; Margaret Orth; Emily Cooper; Joshua R. Smith, all of Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 08/935,466

(22) Filed: Sep. 24, 1997

(51) Int. Cl.[7] .............................. B32B 3/06; D03D 15/00
(52) U.S. Cl. ...................... 428/100; 428/101; 428/102; 442/208; 442/209; 442/210; 2/905; 139/1 R; 139/425 R; 361/212
(58) Field of Search .......................... 361/212; 139/1 R, 139/425 R; 2/905; 428/98, 99, 100, 101, 102; 442/31, 208, 209, 210, 902, 212, 214; 200/502; 439/67, 78, 86, 284, 285, 291, 620

(56) References Cited

U.S. PATENT DOCUMENTS

| | | | | |
|---|---|---|---|---|
| 3,160,790 | * | 12/1964 | Mittler | 317/101 |
| 3,631,298 | * | 12/1971 | Davis | 317/101 |
| 4,158,103 | * | 6/1979 | Danilin et al. | 174/68.5 |
| 4,239,046 | * | 12/1980 | Ong | 128/640 |
| 4,654,748 | * | 3/1987 | Rees | 361/220 |
| 4,761,005 | * | 8/1988 | French et al. | 273/1 |
| 4,963,768 | * | 10/1990 | Agrawal et al. | 307/465 |
| 5,499,927 | * | 3/1996 | Ohno et al. | 439/285 |
| 5,774,341 | * | 6/1998 | Urbish et al. | 361/774 |
| 5,802,607 | * | 9/1998 | Triplette | 2/1 |
| 5,843,567 | * | 12/1998 | Swift et al. | 428/221 |

OTHER PUBLICATIONS

Inaba et al., "A Full–Body Tactile Sensor Suit Using Electrically Conductive Fabric and Strings," *Proc. of IROS 96* at 450 (1996).

IBM Technical Disclosure Bulletin; vol. 34 No. 7B, pp. 199–200, Dec. 1991.*

* cited by examiner

Primary Examiner—Ellis Robinson
Assistant Examiner—John J. Figueroa
(74) Attorney, Agent, or Firm—Cesari and McKenna, LLP

(57) ABSTRACT

Fabrics are used as integral elements of electrical circuitry—to facilitate control over the operation of external components connected thereto, to serve as substrates onto which electrical components are connected, or as the electrical components themselves. In one aspect, selective, anisotropic electrical conductivity is achieved using conductive fibers running along one weave direction and non-conductive fibers running along the opposite direction. The conductive fibers, which may be continuous or arranged in lanes, serve as electrical conduits capable of carrying data signals and/or power, and may be connected, for example, to electrical components soldered directly onto the fabric. In a second aspect, passive electrical components are integrated directly textiles using threads having selected electrical properties.

38 Claims, 7 Drawing Sheets

ELECTRICALLY ACTIVE TEXTILES AND ARTICLES MADE THEREFROM

FIELD OF THE INVENTION

The present invention relates to fabrication of electronic devices and circuits, and in particular to the integration of such devices and circuits into textiles.

BACKGROUND OF THE INVENTION

Electrical circuits are typically assembled by soldering active and passive electrical components onto solid boards. The components receive power and exchange signals by means of a network of conductive metal traces on one or both sides of the board. This approach to circuit fabrication, while virtually universal, nonetheless limits the manner in which electronic devices are housed and used. Generally, rigid boards are contained within an equally rigid cabinet, which sits on, or serves as, a piece of the user's furniture, or is instead mounted on an equipment rack. Indeed, the notion of electronics being packaged in "boxes" is so ubiquitous that alternatives are difficult to imagine.

But as the miniaturization of circuits continues, and as the range of materials from which electronic components may be formed expands, alternatives to traditional housings will assume increasing importance. In particular, much current research attempts to associate electronic circuitry more intimately with the user, so that its operation becomes a natural part of everyday action and routine. In this way, the user is spared the need to deliberately "operate" an external system, while the range of useful tasks amenable to electronic control or assistance is dramatically increased: environmental control, location monitoring, and exchange of information can all be effected without effort by the user or proximity to an external electronic device. In other words, by associating circuitry with the user rather than requiring the user to seek out the circuitry, the user need not interrupt or modify ordinary behavior to interact with electronics; instead, the electronics conforms to the behavior of the user.

Integrating electronic circuitry with clothing represents perhaps the most intimate (in the sense of proximity) and casual (in the sense of effortless availability) application of electronics to the everyday lives of individuals. While appealing, however, the idea of "wearable circuitry" remains elusive. People have long preferred the feel of woven cloth against the skin, conforming as it does to the human form and natural movements without discomfort. Directly integrating stiffly mounted electronic circuitry into traditional textiles would defeat their fundamental appeal.

Indeed, the characteristics of fabrics that render them ideal as clothing also offer advantages in numerous other applications. Fabrics can assume a wide variety of textures and appearances, as well as shapes and volumes; they are flexible, accommodate stress and movement without damage, and can be laundered. It is just these characteristics that traditional modalities for mounting electronic components lack.

DESCRIPTION OF THE INVENTION

Brief Summary of the Invention

In accordance with the present invention, fabrics are used as integral elements of electrical circuitry—to facilitate control over the operation of external components connected thereto, to serve as substrates onto which electrical components are connected, or as the electrical components themselves. Electronic textile devices can interact with users and/or the environment by, for example, touch- or humidity- sensitive elements, and offer the mechanical versatility and virtually limitless range of applications ordinarily associated with fabric. The textile devices of the present invention can be folded, rolled, or wadded up. They can be sewn into wearable articles of clothing, stuffed to form three-dimensional objects such as toys and sculptures, or stretched within a frame. Because the electrical devices are located within the matrix of the fabric itself, or may be conveniently removed if unable to withstand immersion in water or other unfavorable environment, the textiles of the present invention may be routinely washed without compromising electrical capability.

Accordingly, in a first aspect, the invention achieves selective, anisotropic electrical conductivity by utilizing conductive fibers running along one weave direction and non-conductive fibers running along the opposite direction. The conductive fibers serve as electrical conduits capable of carrying data signals and/or power, and may be connected, e.g., to electrical components soldered directly onto the fabric. A source of electrical power can be applied, for example, to a first end of selected ones of the conductive fibers, and electrical measurements taken (or signals read) from the opposite end. At one extreme, all of the fibers running along one direction are conducting, with the fabric structured to prevent inadvertent contact (and consequent electrical shorting) between adjacent conducting fibers. In this way, the fabric can be used as a high-density, high-capacity ribbon cable, with each fiber capable of receiving an independent connection; or as a high-density breadboarding facility to which electronic components can be directly soldered or adhered using electrically conductive adhesive (the latter option offering greater mechanical flexibility). For breadboarding applications, the fabric can simply be cut where signal lines are to terminate (e.g., between opposing pins of an integrated circuit).

Alternatively, the conductive fibers can be arranged in lanes, each lane comprising one or a series of parallel, adjacent conductive fibers, the lanes being separated from each other by at least one non-conductive fiber. This construction ensures greater separation between current paths, and affords relatively large contact areas for connection to components and terminals. For example, electrical connection to a lane of conductive fibers can be achieved by means of traditional fabric fasteners, such as snaps, zippers, studs, buttons, grommets, staples, conductive hook-and-pile materials, or hook-and-eye fasteners.

In another alternative, the conductive lanes can be strips of electrically conductive fabric attached to a non-conductive fabric substrate by, for example, an adhesive or stitching.

In addition to serving as substrates that receive electrical components and facilitate connection therebetween, such fabric structures can be used to control external circuitry. For example, two fabric panels can be overlaid with their conductive lanes opposed and crossing at an angle, the panels being normally held apart such that compression causes electrical contact between opposed lanes. Depending on the details of implementation, this construction can serve, for example, as a switch matrix or as a touchpad that senses the physical location of a user's contact. Either of these implementations is itself suited to a wide variety of applications. A switch matrix, for example, can have a surface design assigning a unique function to each of the lane crossings (e.g., calculator numbers, musical-instrument keys, etc.), with the fabric panels connected to external (or detachable) circuitry that implements the functions in response to user interaction with the panels.

Isotropically conductive fabrics can also prove useful for some applications. For example, a fabric comprising a woven matrix of conductive fibers running in both directions can be used to capacitively or electrically couple electronic components, or in sheet form can serve as an electrostatic antenna. Large sheets of isotropically conductive fabrics can also be used to effect capacitive coupling to the environment.

In a second aspect, the invention comprises fabrication of circuit traces and passive electrical components into textiles using threads having selected electrical properties. The threads may be applied to the fabric by sewing, embroidering, or weaving directly into the fabric matrix; alternatively, patches of electrically conductive fabric material can be attached to a nonconductive fabric as described above. For example, capacitors can be formed using extended parallel lanes of conductive material separated by non-conductive fabric that serves as a dielectric, or by spaced-apart patches of conductive material. Inductors and transformers can be formed from one or more spiral lengths of conductive material; in the case of a transformer, for example, the spirals may be concentrically disposed and magnetically coupled.

The threads and fibers used in the fabrication of articles in accordance with the present invention can take several forms. Fabrics may contain metallic or metalized cotton fibers interwoven with ordinary, non-conductive fibers. Such fibers can also be formed into conductive threads that may be sewn into non-conductive fabric substrates. Other suitable conductive threads are formed by spinning polymer and metal fibers together into a thread or yarn. The degree of resistivity of the thread or yarn is determined by the ratio of metal to polymer fiber. Because the integrity of individual spun fibers remains intact, the resulting thread exhibits the strength and mechanical properties of traditional thread with the conductivity conferred by the conductive fibers.

BRIEF DESCRIPTION OF THE DRAWINGS

The foregoing discussion will be understood more readily from the following detailed description of the invention, when taken in conjunction with the accompanying drawings, in which.

Figure 1:
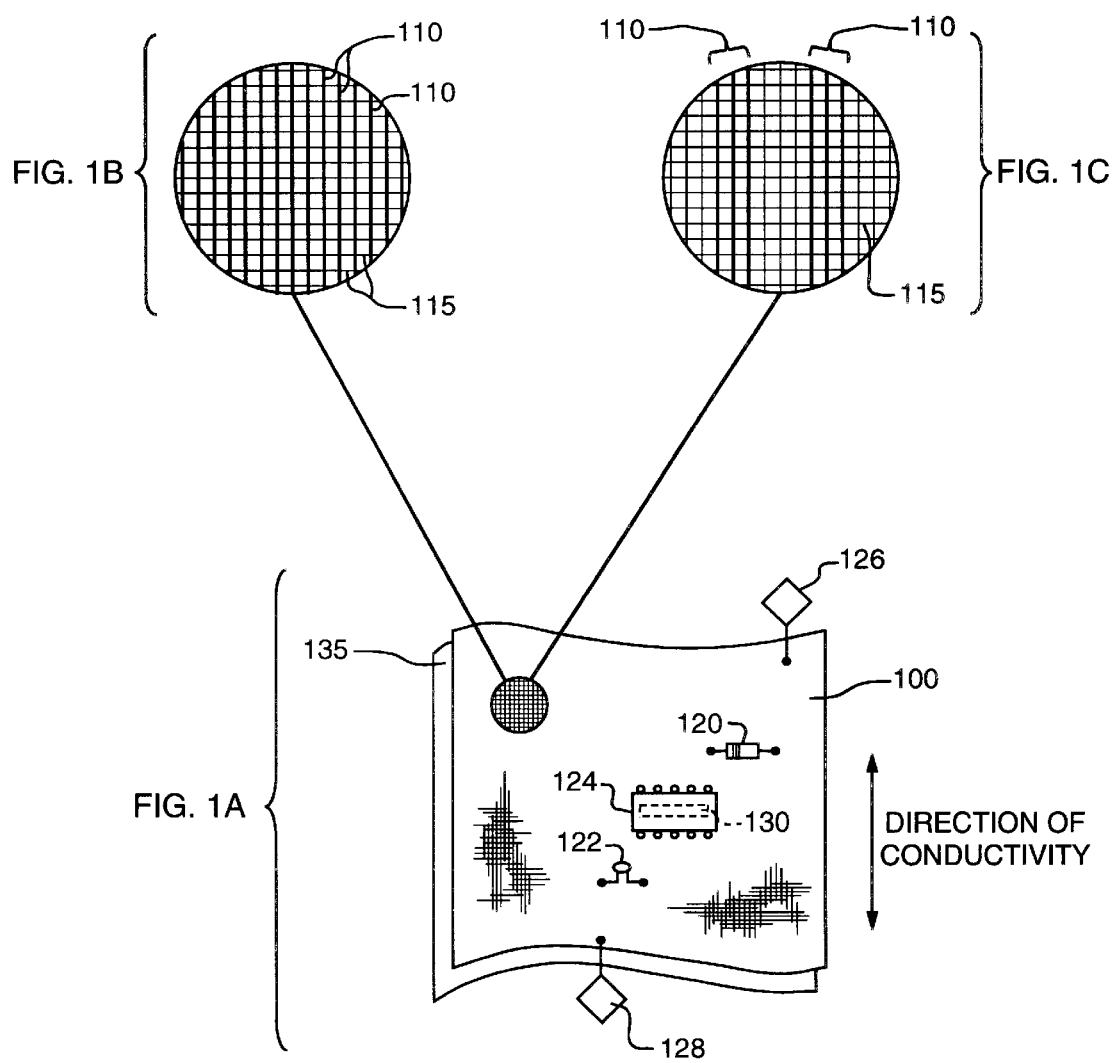
FIG. 1A is a plan view of a fabric used to establish electrical connections among circuit components.
FIGS. 1B and 1C are enlarged illustrations of alternative woven matrices forming the fabric shown in FIG. 1A.

DETAILED DESCRIPTION OF THE PREFERRED EMBODIMENTS a. Fabric-Mounted Circuitry Applications Refer first to FIGS. 1A–1C, which illustrate an anisotropically conductive, woven fabric in accordance with the invention. The fabric 100 may be an "organza" textile comprising two types of fibers: an ordinary, non-conductive (e.g., cotton or silk) fiber on the warp, and a conductive fiber running perpendicularly on the weft. The conductive fiber may be a fully metallic strand; a fiber or cotton fiber plated or coated with a metal or other conductive material; or a silk or other non-conductive thread uniformly wrapped in a very thin layer of metal (e.g., copper, gold or silver) foil. In traditional organza textiles, the foil is wrapped around the thread in a spiral, thereby retaining the tensile strength of the unmodified thread. It is also possible to coat the exterior surface of the foil with one or more electrically active layers (e.g., a semiconductor p-type or n-type material), thereby forming a coaxial structure having electrical properties differing from those of an ordinary wire.

As shown in FIG. 1B, the conductive fibers 110 may be continuously adjacent along the weft; that is, in FIG. 1B, every fiber 110 of the the weft is conductive, while the fibers 115 of the warp are non-conductive. The spacing between fibers 110, and the structural integrity provided by the weave, allow each fiber 110 to be individually addressable without shorting even if the fabric is stretched along the bias. In particular, the thickness of the fibers and their frictional contact with each other are selected to accommodate a given weave density. (Within limits, although dense weaves bring adjacent conductive fibers into close proximity, the density also provides additional mechanical stability that prevents contact between fibers.) Essentially, the fabric 100 functions as a dense ribbon cable. In the case of foil-covered silk fibers, the silk core has a high tensile strength and can withstand high temperatures, allowing the fabric 100 to be woven with industrial machinery. Suitable textiles of this type are known and have been used for some time for ornamental purposes.

The fibers 110 of this fabric are conveniently utilized to create electrical circuits, with component leads soldered or otherwise electrically connected to the fibers 110. This is illustrated in FIG. 1A. The leads of a resistor 120 and a capacitor 122, as well as the pins of an integrated circuit 124, are soldered to single fibers of the fabric 100. A pair of connectors 126, 128 facilitate external connection to the electronic components mounted on fabric 100. The direction of conductivity, shown by the arrow, reflects the direction of the weft (and, hence, the run of fibers 110). Accordingly, the fibers carry current between components soldered to the same fiber, i.e., those with leads appearing directly above or below each other in FIG. 1A. To terminate signal lines or avoid unwanted connections, the fibers can simply be cut; thus, an incision 130 is made below integrated circuit 124 to avoid electrical communication between opposed pins, permitting separate connections thereto.

The fabric-mounted circuit shown in FIG. 1A can be handled and used like any fabric panel. Indeed, its flexibility can free designers of electrical circuits from the constraints of two-dimensional board layouts; a fabric-mounted circuit can literally be tailored to the contours of a particular housing, or even rolled up for efficient use of volumetric space. To prevent fibers 110 from making unwanted contact as a result of folding, the fabric 100 may be provided with a non-conductive coating (e.g., a transparent acrylic coating that may be sprayed on) following affixation of the electronic components. Alternatively, an insulating layer 135 may be applied to one or both sides of the fabric 100. Insulating layer 135 can, if desired, be a textile with handling characteristics similar to those of fabric 100.

With conductive fibers 110 arranged in discrete, spaced-apart lanes, as shown in FIG. 1C, the connection density of fabric 100 is reduced, but connections are simplified, and the need for a tight weave structure to prevent shorting is reduced or eliminated. Since connectors 126, 128 need not be connected to a single fiber and isolated from adjacent fibers, they can take the form of more traditional fabric fasteners. For example, connectors 126, 128 may be snaps, zippers, studs, buttons, grommets, staples, conductive hook-and-pile materials, or hook-and-eye fasteners—essentially any electrically conductive component that can pierce or otherwise establish electrical contact with the fabric and a complementary fastener. The complementary fastener may be attached, for example, to another piece of fabric and connected to a power source, an output device, a cable for connection to another fabric-mounted circuit, etc. Furthermore, the fastener may be chosen to confer a desired electrical property, e.g., resistance, capacitance, or nonlinear conductance. So-called gripper snaps are particularly preferred as fasteners, because the manner in which the snap pierces the fabric fibers when it is attached to the fabric creates a robust electrical connection.

These types of fabrics, which conduct electricity along the entire length or width of a panel, or isotropically conductive fabrics that conduct electricity along both dimensions, can be used as large-scale electrodes in clothing applications to conduct electricity from one part of the body to another, or from one accessory or article of clothing to another (e.g., from shoes to a wristwatch via conductive socks, pants and shirt). Such fabrics can also be used to sense the user's presence, orientation or body characteristics (e.g., joint angles, hand spacing, the distance of a hand from another point on the body, foot spread, or spacing from another person wearing a similar fabric) in accordance with copending application Ser. Nos. 08/640,569 and 08/606,540, the entire disclosures of which are hereby incorporated by reference.

It is also possible to selectively create lateral connections among various longitudinal lanes without resort to a fully isotropic fabric structure. For example, some of the fibers 115 may be conducting fibers connecting various ones of the lanes 110. To prevent contact between a lateral conductive fiber and a particular lane, brocading or other textile-fabrication techniques can be used to introduce an insulating material (e.g., more of the non-conductive fibers) between the lateral fiber and the lane of conductive fibers. For example, the lateral conductive fiber can be woven through lanes with which electrical contact is desired, and retained on one or the other side of other lanes (without weaving therethrough) and separated from the fibers of these other lanes by a brocaded layer of non-conductive fiber.

b. Switching and Contact Applications

Electrically active textiles can also be created by sewing, embroidery or weaving of conductive thread into a substantially non-conductive fabric matrix or substrate. Conductive threads are known and generally available for applications such as producing filters for the processing of fine powders. Typically, the threads are formed by spinning together fibers of a polymer such as KEVLAR with fibers of a metal such as stainless steel. The degree of resistivity of the thread or yarn is determined by the ratio of metal to polymer. A typical ratio is 95% KEVLAR to 5% stainless steel, which produces a thread (of standard thickness) having a resistivity of about 100 $\Omega$/cm. Because such threads may not be isotropically conductive, electrical contact is a probabilistic function of the extent of mechanical contact (leading, as a practical matter, to minimum contact areas to ensure electrical connection).

Figure 2:
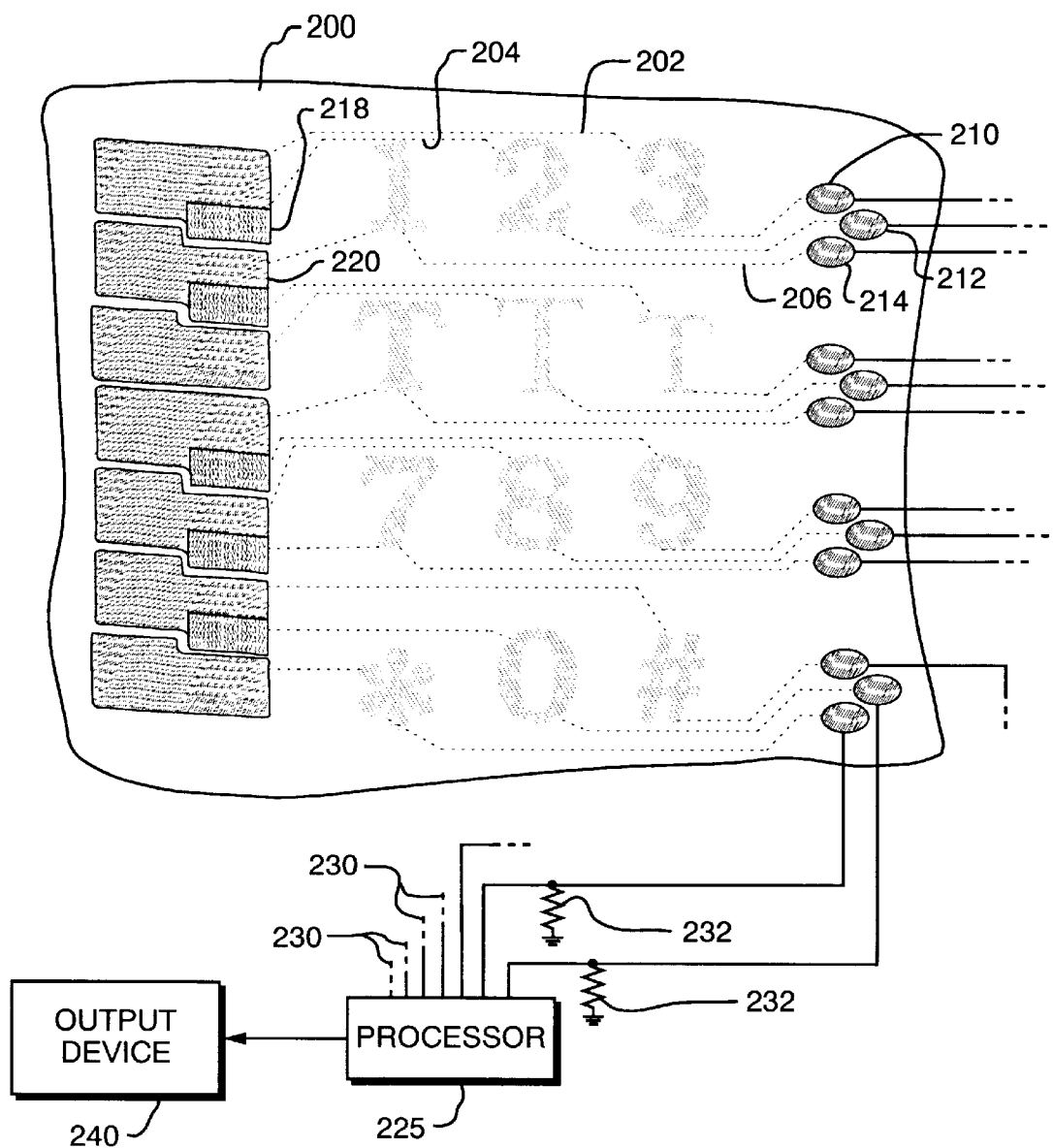
FIG. 2 is a partially schematic view of a keypad embodiment of the invention.

An application of this approach is shown in FIG. 2. A panel 200 of a non-conductive fabric is provided with an embroidered pattern using a conductive thread. Each of the embroidered characters contains a pair of leads connecting the character to conductive patches that serve as terminals. For example, the characters "1", "2" and "3" have a series of leads 202, 204, 206 connecting, respectively, to terminal patches 210, 212, 214, as well as to a series of additional conductive patches 216, 218, 220. Panel 200 can be used as an input device, in the manner of a keyboard, as follows.

A timing circuit 225, which may be implemented using discrete electronic components or may instead be based on a microprocessor (e.g., one of the microprocessors supplied by Microchip Technology Inc., Chandler, Ariz.), includes a series of bidirectional input/output (I/O) terminals 230. In an output mode, each terminal 230 can be set to a low (usually ground) or high (usually 5V) level, while in an input mode, the terminal assumes a high-impedance state and can measure an applied voltage. The terminals may be instantly switched between modes, e.g., in accordance with a program executed by circuit 225. Furthermore, circuit 225 preferably includes programmable timing capability.

Each terminal 230 is connected to one of the terminal patches (e.g., patches 210, 212, 214, etc.), and also to a large (e.g., 1–10 M$\Omega$) leakage resistor 232; terminals 230 are sufficiently numerous to provide connection to every terminal patch of fabric 200. Each terminal 230 is rapidly cycled between high-level output and input modes. When a terminal is driven high, charge accumulates on the associated character and conductive patches to which it is connected. When the terminal is switched to input mode, circuit 225 measures the time required for the charge to dissipate through leakage resistor 232 and reduce the voltage at the terminal to a predetermined level. When the user makes contact with one of the characters, its capacitance increases, resulting in greater charge accumulation and, consequently, a longer decay time. It is this variation in decay times that is reliably used by circuit 225 to detect user contact with a character.

Circuit 225, which may be removably attached to panel 200 (by means of conductive fasteners, as described above) to facilitate washing of the panel, manipulates information as appropriate and drives an output device 240. For example, output device 240 may be a display, circuit 225 causing device 240 to show particular messages depending on the sequential pattern of characters pressed by the user.

The above-described keyboard functionality can also be realized in other ways. For example, a signal (e.g., a continuous train of clock pulses) can be transmitted over a user's body in accordance, e.g., with allowed application Ser. No. 08/436,982 (the entire disclosure of which is hereby incorporated by reference) and detected by a processor circuit via the conductive characters. That is, when the user touches one of the characters, the signal is transmitted to the processor circuit through the user's touch of a character; so long as the processor is able to distinguish among the characters (e.g., by connecting each character to a separate input terminal), the touched character is identified directly.

Figure 3:
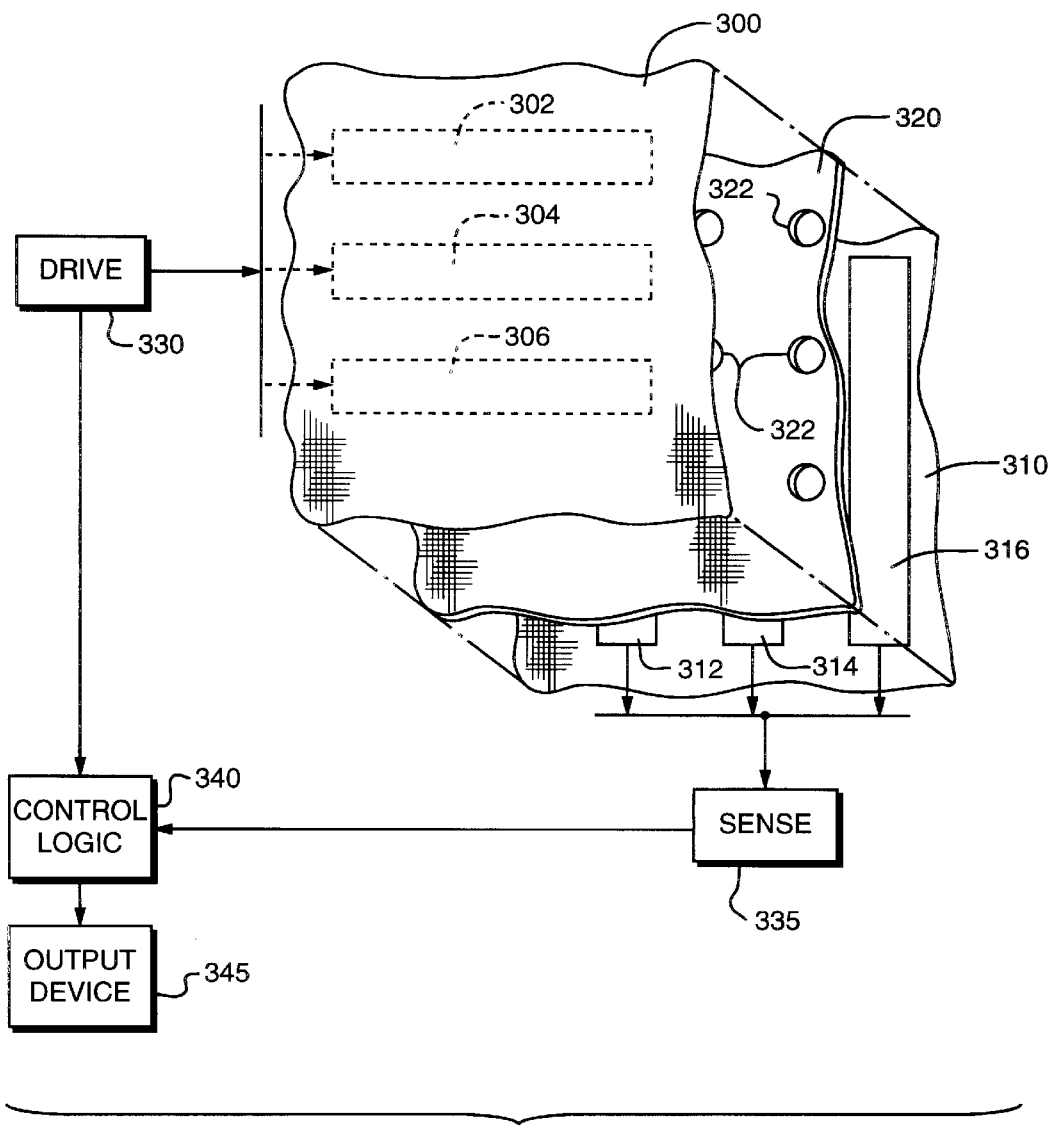
FIG. 3 is an exploded, partially schematic view of a switch-matrix embodiment of the invention.

A "piece work" application utilizing sewn strips of conductive material to form a switch matrix is shown in FIG. 3. A first fabric panel 300 has sewn or otherwise adhered on the reverse side thereof a series of three parallel rows of conductive material 302, 304, 306. A second fabric panel 310 has sewn (or otherwise adhered) on the obverse side thereof a series of three parallel columns of conductive material 312, 314, 316. The rows 302, 304, 306 run perpendicular to columns 312, 314, 316, crossing one another at unique regions of overlap. A matrix utilizing m conductive rows on panel 300 crossing n conductive columns on panel 310 offers m×n separate regions of contact, each of which may be associated with a different function or informational significance. For example, panel 300 may contain a surface design illustrating characters or drawing figures overlying the various contact regions. The conductive material itself may be, for example, an isotropically conductive fabric—i.e., having conductive fibers running along both the weave and the weft.

A panel of soft, thick fabric 320 such as felt, velvet, netting or quilt batting, is sandwiched between panels 300, 310 when these are joined. Panel 320 is provided with a series of holes 322 at the regions of overlap, thereby permitting contact between opposed conductive regions when the user presses the corresponding point on the overlying face of panel 300. When the user presses a region of overlap, the intervening layer 320 provides a springy, button-like effect that is mechanically responsive to the user's touch. A voltage source 330 may be used to drive the three rows 302, 304, 306, and a detector 335 capable of sensing an applied voltage connected to rows 312, 314, 316. Connection between the rows and columns, and the voltage source and detector, may occur by way of standard (but conductive) fabric fasteners, thereby allowing the fabric structure to be completely removed from external circuitry.

Detector 335 (and, depending on the configuration, voltage source 330 as well) may be connected to a control logic unit 340, which recognizes the particular overlap region that the user selects by pressing, and takes appropriate action based thereon (such as driving an output device 345 in accordance with the user's selections). Control logic unit 340 and output device 345 may collectively comprise, for example, a music synthesizer, with each region of overlap corresponding to a different musical note, so that the user can "play" the switch matrix as an instrument. Logic unit 340 may instead be programmable computer containing various sets of instructions, each corresponding to a different application reflecting different usages of the switch matrix. Different surface designs corresponding to the various applications (e.g., different games or activities) may be interchangeably applied to the surface of panel 300 (e.g., by VELCRO hook-and-pile strips).

Any of various circuits can be employed to facilitate sensing of the particular overlap region selected by a user. In one approach, each of the rows 302, 304, 306 is driven at a different voltage level, and each of columns 312, 314, 316 is connected to a different separate input terminal of control logic 340, which can thereby distinguish among them; the combination of voltage level and column identity unambiguously identifies the selected overlap region. Alternatively, the rows 302, 304, 306 may be driven at the same voltage, but separately, with driving circuit 330 equipped to sense loading at the different rows so as to determine which has been connected (by the user's touch) into a completed circuit. In this case, voltage source 330 also reports to control logic 340, as indicated by the arrow. In yet another alternative, a voltage is applied to rows 302, 304, 306 in a time-multiplexed fashion, allowing conrol logic 340 to distinguish among rows by their unique, time-based identities.

The arrangement shown in FIG. 3 can be used in applications other than switching. For example, the rows and columns can facilitate matrix addressing. An array of addressable components (e.g., LEDs) can be arranged such that the leads of each component are connected to a row and to a column. By, for example, selectably grounding a row and driving a column at an operating voltage, the component at the intersection of the selected row and column is activated.

In an alternative approach, it is possible to utilize capacitive sensing rather than direct contact as the switching mechanism. That is, a voltage is applied to rows 302, 304, 306 by circuit 330. The rows are capacitively coupled to columns 312, 314, 316 across panel 320 (which need not have holes 322), the degree of coupling—i.e., the induced voltage in the columns—being sensed by circuit 335. When the user places a finger over one of the overlap regions, the capacitance increases, and the increased voltage is sensed by circuit 335. So long as the rows are somehow distinguishable—e.g., by time-multiplexing the applied voltage among the rows—identification of the selected overlap region is straightforward. An advantage to this configuration is the ability to detect the pressure the user places on an overlap region. An elastic (e.g., foam) panel 320 provides resistance to applied pressure so that the harder a user presses against an overlap region, the closer the adjacent row and column strips will be driven, and hence the larger will be the capacitance. Thus, the sensed voltage indicates not only the selected overlap region, but the degree of pressure as well. This capability is highly useful in applications such as musical instruments.

In still another alternative, a second switch matrix directly overlying the illustrated switch matrix can be employed to permit sensing of the velocity of the user's touch (i.e., the speed of attack). For example, an additional series of conductive rows can be sewn or otherwise adhered to the obverse side of panel 300, and another set of conductive columns provided on an additional fabric panel overlying panel 300 (but separated therefrom by an additional intervening panel) such that the overlap regions directly overlie the overlap regions between panels 300, 310. When the user presses one of the overlap regions, both sets of row-column strips will make contact, but the set closer to the user will make contact before the underlying set. The attack speed is obtained by measuring the time between these successive switch contacts. Once again, this capability is highly useful in musical-instrument applications.

Various alternatives to sewn strips of conductive material are also possible. For example, rows 302, 304, 306 and columns 312, 314, 316 can be formed integrally within fabric panels 300, 310, respectively, by lanes of conductive thread within the weft, as discussed above. In another approach, the rows and columns are stripes of conductive thread sewn into non-conductive fabric panels 300, 310. In still another approach, strips of conductive material may be coated with a semiconductor to form nonlinear thresholding elements at the overlap regions that prevent false contacts and/or phantom switching. For example, rows 302, 304, 306 may be coated with an n-type material, and columns 312, 314, 316 with a p-type material. When a row is forced against a column at an overlap region, a diode is formed and current flows. Because of the nature of the p-n junction, however, current flows only from the addressed row, for example, to the column or columns with which it makes direct contact. With ordinary conductive row-and-column junctions, by contrast, current is free to flow from an addressed row to a contacted column, as well as to a second (unaddressed) row also contacted by that column, and finally to another column contacted not by the addressed row but instead by the (unaddressed) second row.

Figure 4:
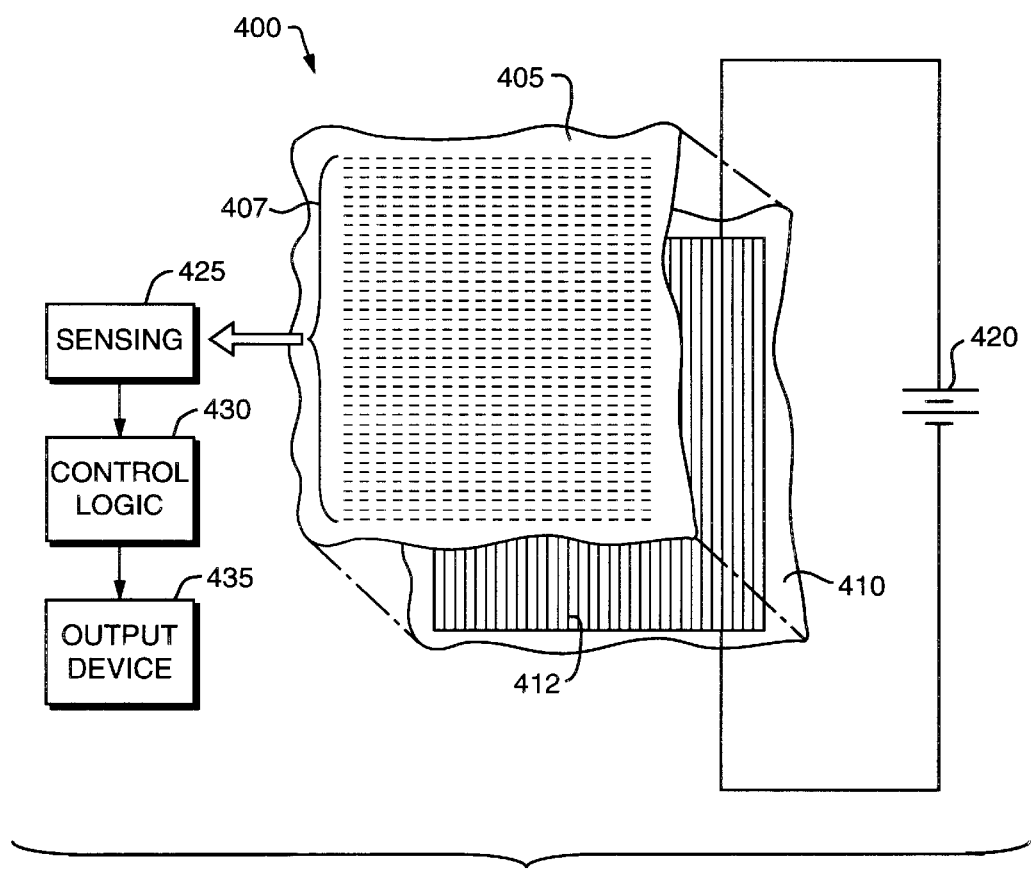
FIG. 4 an exploded, partially schematic view of a touchpad embodiment of the invention.

The latter approach is particuarly useful in a related application, which utilizes closely spaced rows of resistive material to form a fabric touch-responsive surface (in the nature of a "touch pad") that identifies the location on a fabric panel that a user selects. With reference to FIG. 4, a touch-sensitive fabric composite 400 includes a first panel 405 has on the reverse side thereof (or sewn so as to penetrate through the reverse side) a series of parallel stripes of conductive material 407. A second fabric panel 410 has on the obverse side thereof a series of parallel stripes of resistive material 412, the stripes 412 running perpendicular to stripes 407. Stripes 407, 412 may be formed from the same material, although resistivity is important only for the latter stripes. A surface design may be impressed on the facing side of panel 405.

A voltage source 420 is connected across the stripes 412, the resistivity of which produces a voltage gradient, from the maximum output level of source 420 to ground, along the length of the stripes 412. Stripes 407 are each separately connected to a sensing circuit 425, which determines the voltage sensed by any of the stripes 405. Basically, sensing circuit 425 is a voltmeter, both ends of each stripe 405 being connected to circuit 425 so that the stripes 405 serves as separately identifiable probes. When a stripe 405 comes into contact with a stripe 412, the voltage sensed by circuit 425 reflects the point along the length of the opposed stripe at which contact was made. This location is provided to a control logic circuit 430, which takes appropriate action (e.g., display or other output) based thereon.

As in previously described embodiments, it is important to prevent inadvertent contact between stripes 405, 412 where the user has not pressed against panel 405. One approach is to use a porous intervening layer between panels 405, 410 that facilitates contact between opposed stripes upon compression between the panels, but which keeps uncompressed portions of the panels apart from each other; the porosity of the intervening layer is sufficient to permit electrical connection at any overlap point. The panels 405, 410 and the intervening layer, it should be emphasized, need not be separate pieces of fabric sewn together. For example, it is possible to weave a composite material having multiple plies using a multi-harness loom; such equipment can be operated to weave conductive stripes directly into panels 405, 410, and to simultaneously weave an intervening layer of desired thread (or yarn) thickness and weave density.

Alternatively, panel 405 may be quilted, with stripes 407 sewn as seams; in this way, stripes 407 will lie in valleys between protruding ridges, the ridges preventing spurious contact among opposed stripes. In still another alternative, stripes 407 may be sewn into a fuzzy material so as to remain recessed within the loft; contact with similarly recessed stripes in an identical, adjacent panel does not occur until the panels are forced against one another by the user's touch.

Generally, the stripes 405, 412 are sufficiently close together to provide a meaningful indication of location, and so that the user is likely to cause contact between opposed, crossing stripes regardless of where s/he presses. The necessary stripe density may also, however, permit compression to cause contact between multiple opposed stripes. Generally the point of contact directly beneath the user's touch will exhibit the largest or least noisy signal at circuit 425, which is configured to select the best voltage reading.

In a representative embodiment, a 5-volt source is connected across 10-cm stripes sewn into a fabric using a resistive thread having an effective resistivity of 100 Ω/cm. A key advantage of the touch sensor 400 is the ability to form it into a structure other than a flat sheet, e.g., by sewing the edges together and stuffing the interior (which may also contain the voltage source and control circuitry) to form a three-dimensional object.

Once again, alternative modes of construction are possible. For example, the stripes 405 and/or 412 may be strips of conductive material sewn or otherwise attached (e.g., by adhesive) to panel 405 and/or panel 410, or may instead be integral within the weave of panel 405 and/or 412 as detailed above in connection with FIG. 1. Obviously, combinations of these approaches are feasible as well.

It should also be emphasized that although precautions as outlined above can be taken to avoid inadvertent contact between opposed current-carrying elements, this may be unnecessary or even undesirable depending on the application. For example, clothing may be designed with panels of fabric as illustrated in FIG. 1B or 1C, and which are intended to rub against one another during use. Such fabrics may also contain regions having varying electrical properties (e.g., different resistivities obtained through the use of different conductive threads or fibers). The multiple and varying regions of contact may drive displays or other output devices to produce unusual, fluid artistic effects.

c. Forming Passive Electrical Components

Figure 5A:
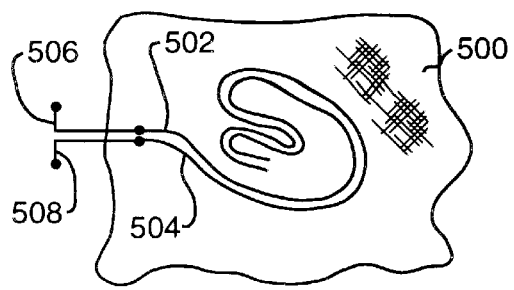
FIGS. 5A and 5B are plan view of textile-based capacitor arrangements.

Passive electrical components may be formed in a fabric in various ways. In one approach, shown in FIG. 5A, a non-conductive fabric panel 500 contains a pair of conductive threads or fibers 502, 504 that run parallel to one another along a path (which may be straight but is preferably circuitous, as shown, to increase the length of adjacency). By virtue of their conductivity and adjacency, the fibers 502, 504 form a capacitor. Fibers 502, 504, constituting the plates of the capacitor, may connect to other electronic components directly or by means of a pair of terminals 506, 508. Desirably, fibers 502, 504 are continuously adjacent to and equidistant from each other throughout the length of the path. Thus, in one embodiment, fibers 502, 504 are sewn into fabric matrix 500 with substantially identical stitching patterns, so that the fibers 502, 504 remain adjacent as they repeatedly cross the weave of matrix 500. Alternatively, if straight lengths are sufficient to confer the desired amount of capacitance, fibers 502, 504 can be integral with the weave of fabric 500, running alongside each other (either adjacently or, again depending on the desired capacitance, separated by one or more intervening non-conductive fibers) as shown in FIGS. 1B and 1C.

Figure 5B:
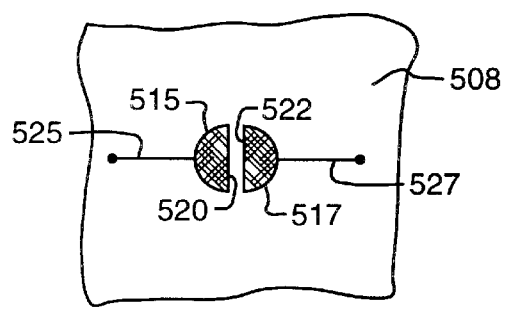

A capacitor can also be formed as shown in FIG. 5B, wherein a pair of patches 515, 517, each embroidered from conductive thread, are disposed adjacent to each other with a pair of opposed, spaced-apart edges 520, 522. Patches 515, 517 behave as the plates of a capacitor when a voltage is applied to one of the conductive contact leads 525, 527 drawn, respectively, out of patches 515, 517. The greater the surface area of patches 515, 517 (particularly inner edges 520, 522—that is, the taller the patches 515, 517 and/or the wider the edges)—the greater will be the capacitance, which is also affected by the amount of space between the opposed edges. Patches 515, 517 can be embroidered directly into fabric 500 using conductive thread, or can instead comprise a woven or other conductive material attached to fabric 500 (e.g., by adhesive or sewing).

The element shown in FIG. 5B can also be used as a switch, e.g., in the manner described above in connection with FIG. 3, by exploiting the fact that the approach of the user's finger toward patches 515, 517 increases the capacitance. For example, a high-frequency AC signal can be applied to one of the patches 515, 517 and sensed by circuitry connected to the other patch. When the user's finger bridges the patches, the capacitance increases and, hence, the impedance decreases, resulting in a larger detected signal.

Figure 5C:
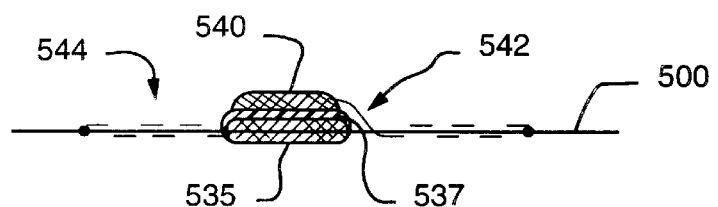
FIGS. 5C and 5D are side elevations of additional textile-based capacitor arrangements.
Figure 5D:
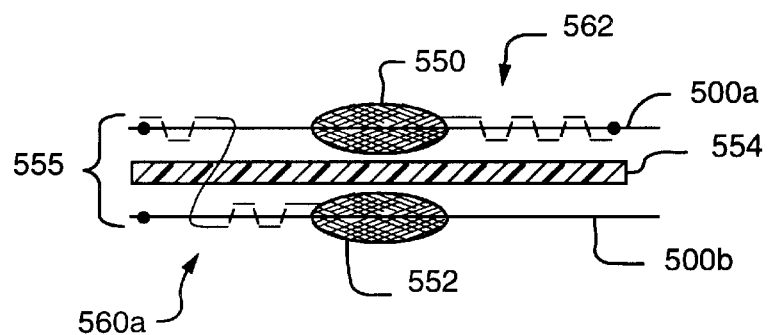

To obtain greater capacitance, the surfaces (rather than the edges) of a pair of patches can be disposed adjacently, as shown in elevation in FIGS. 5C and 5D. In FIG. 5C, a first patch 535 is embroidered into the matrix of fabric 500 using conductive thread. A face of patch 535 is covered by a patch 537 of a non-conductive, dielectric material, such as a layer of fabric, an applied layer of adhesive, etc. A second conductive patch, preferably coextensive in area with patch 535, is disposed over non-conductive patch 537, thereby forming a capacitor. A conductive contact lead 542, which may simply be the end of the conductive thread making up patch 540, is taken from the patch and, if desired, stitched into fabric 500. A similar lead 544 is taken from patch 535.

Once again, one or both of patches 535, 540 may be formed from an already-woven conductive material attached to panel 500, instead of being built up on that panel by embroidery.

In the alternative shown in FIG. 5D, a pair of patches 550, 552 are embroidered into (or attached onto, or woven into) separate panels of fabric 500a, 500b. The panels are separated by an intervening dielectric layer 554, which may be simply another layer of fabric 500, or a more traditional dielectric material such as plastic. When the layers are combined into a composite construction 555, patches 550, 552 overlie each other across layer 554. A contact lead 560 drawn from patch 552 can be brought through layer 550 and into layer 500a, thereby allowing both capacitor leads 560, 562 to reside on the same fabric panel 500a for connection to other components. Using this approach, it is possible to conveniently obtain relatively large capacitor "plate" areas; for example, panels 500a, 500b can be concentric cylindrical sleeves, with patches 550, 552 radially aligned and extending around the entire circumferences.

Figure 6A:
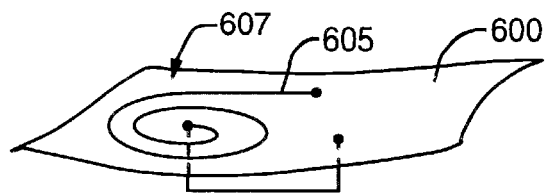
FIGS. 6A–6C are isometric views of textile-based inducor arrangements.

An inductor may be formed as shown in FIG. 6A. A non-conductive fabric matrix 600 has a conductive (and, desirably, magnetically permeable) fiber or thread 605 stitched into a spiral pattern 607. The ends of fiber 605 are connected to other electronic circuitry on matrix 600, or to external circuitry using conductive fasteners as described above. To avoid resistive effects (which can, for example, reduce the Q-factor of the inductor), it is preferred to use fiber of low resistivity, such as the foil-wrapped fibers used in organza fabrics or a conductive thread having a high metal content. It may also be preferred that matrix have enhanced magnetic permeability (although not electrical conductivity) in the region of spiral 607 in order to concentrate the magnetic field within the region of the inductor.

Figure 6B:
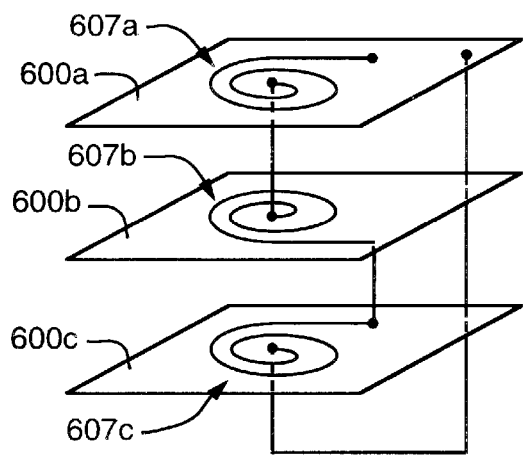

Greater inductance can be obtained by expanding the size of spiral pattern 607, or by stacking multiple layers of fabric 600a, 600b, 600c, each with its own spiral pattern 607a, 607b, 607c, as shown in FIG. 6B. To maintain proper current flow through each spiral pattern, the layers 600a, 600b, 600c are isolated from one another, e.g., using intervening fabric panels (not shown). This design will, however, introduce capacitance, and the component will behave as an LC circuit rather than as an inductor.

Figure 6C:
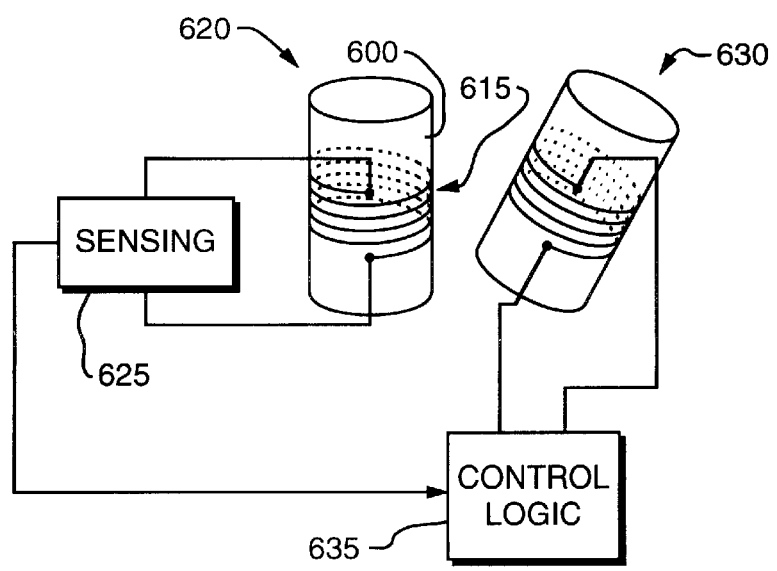

In another embodiment, illustrated in FIG. 6C, the fabric panel 600 is formed into a cylindrical sleeve, and the spiral pattern 615 formed by winding a conductive fiber around the circumference to form the inductor structure 620. For example, panel 600 may in this case be a cuff or a shirtsleeve segment. Any of the foregoing inductor designs can be used in pairs or groups, disposed closely enough to each other so the coils magnetically couple, to determine the orientation of one or more of the inductors; this permits, for example, construction of fabrics that "know" their own orientation.

Such an approach is shown in FIG. 6C, where inductor 620 is connected to a sensing circuit 625 that measures the current produced in inductor 620 as a result of magnetic coupling to another inductor 630, which is energized by a control logic circuit 635. The orientation and proximity of inductor 630 with respect to inductor 620 determines the degree of magnetic coupling, and hence the induced current level, in the latter inductor. This current level may be provided to control logic 635, as indicated in the figure, for use in connection with a desired application embodied in the control logic. Multiple energized coils with known orientations and positions, and magnetically coupled to sensing coil 620, can be used to determine the orientation of coil 620 with precision.

The inductors described above may be used, e.g., as coil antennas for reception and/or broadcast. It should be noted, however, that other types of antennas can also be realized with the invention. For example, connecting a voltage source across an anisotropically or isotropically conductive fabric exhibiting some resistivity creates a dipole that can be used as an electrostatic antenna to sense the magnitude and orientation of an electric field gradient.

Figure 7A:
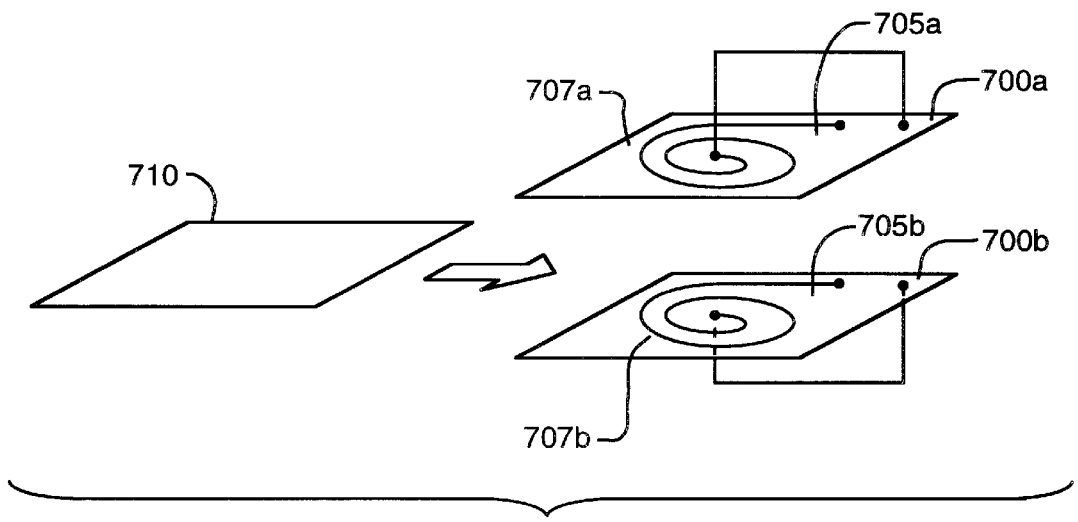
FIGS. 7A and 7B are isometric views of textile-based transformer arrangements.
Figure 7B:
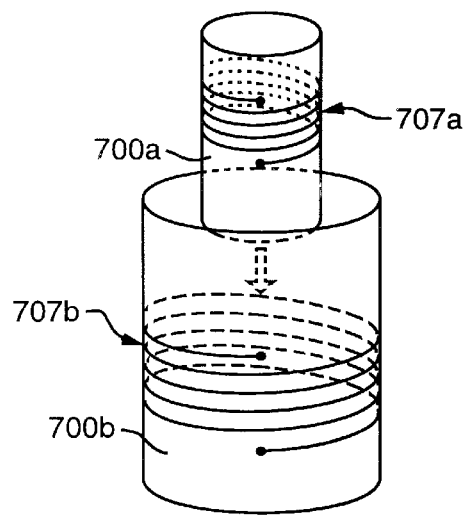

A transformer may be formed as shown in FIGS. 7A, 7B. In FIG. 7A, a pair of fabric panels 700a, 700b each has a conductive, magnetically permeable fiber or thread 705a, 705b stitched into a spiral pattern 707a, 707b. The spirals each connect to other fabric-borne circuitry, or terminate in a pair of conductive fasteners for external connection. The panels 700a, 700b are spaced closely enough (and, desirably, are oriented parallel) to permit magnetic coupling between the spiral patterns 707a, 707b. Energizing one of the spirals induces a current in the other spiral, the induced voltage being proportional to the ratio of turns in the two spirals. An intervening, non-conductive fabric panel 710 may be introduced between panels 700a, 700b to maintain separation therebetween, or the spiral patterns 707a, 707b may be isolated from each other by disposing them on opposite sides of the respective fabric panels without penetration through the fabric.

Alternatively, the panels 700a, 700b can be formed into concentric cylindrical sleeves, with spirals 707a, 707b wound around the circumferences and radially aligned with each other during use. In this case, panels 700a, 700b may, for example, be part of the sleeves of a jacket and a shirt worn thereunder.

Resistors are straightforwardly formed simply by using conductive thread or fabric having a desired degree of resistivity. Resistive networks can be formed using threads or fabrics of varying resistivities.

It will therefore be seen that the foregoing represents a new and highly versatile approach to the construction of electrical circuits using fabrics both as substrates and to form electrical components. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A textile fabric having electrical functionality, the textile fabric comprising:
 a. a first series of parallel fibers, said fibers being electrically non-conductive;
 b. interwoven therewith in a perpendicular direction thereto, a second series of parallel fibers, at least some of said fibers being electrically conductive, said first series and second series of parallel fibers forming a matrix;

c. a plurality of electrical components located within said matrix of the textile fabric itself and electrically connected to at least some of said electrically conductive fibers, the conductive fibers establishing electrical connections among said components; and d. contact means, physically affixed and electrically connected to at least some of the conductive fibers, for receiving an electrical connection to said electrical components so as to form an electrical circuit.

2. The textile fabric of claim 1 wherein the contact means is a conductive snap.

3. The textile fabric of claim 1 wherein the contact means is a zipper.

4. The textile fabric of claim 1 wherein the contact means is a first complementary member of a two-member conductive hook-and-pile material.

5. The textile fabric of claim 1 wherein the contact means is a first complementary member of a two-member hook-and-eye fastener, the first complementary member mating with a second complementary member.

6. The textile fabric of claim 1 wherein the contact means is an electrically conductive stud.

7. The textile fabric of claim 1 wherein all of the second series of fibers are conducting, the first and second series of fibers being interwoven so as to prevent contact between adjacent second-series fibers.

8. The textile fabric of claim 1 wherein the conductive second-series fibers are arranged in a plurality of lanes each comprising a plurality of adjacent conductive fibers, adjacent lanes being separated from each other by at least one non-conductive fiber.

9. A textile fabric having electrical functionality comprising first and second adjacent panels, each panel comprising:

a. a first series of parallel fibers, said fibers being electrically non-conductive;

b. interwoven therewith, a second series of parallel fibers, at least some of said fibers being electrically conductive, said conductive fibers being arranged in a plurality of lanes each comprising a plurality of adjacent conductive fibers, adjacent lanes being separated from each other by a plurality of non-conductive fibers; and c. contact means, electrically connected to at least some of the lanes, for receiving an electrical connection thereto, and further wherein d. the lanes of the first panel cross the lanes of the second panel; and e. the panels are held apart to prevent inadvertent contact between overlapping lanes, compression of the panels at regions of lane overlap causing electrical contact between a lane of the first panel and a lane of the second panel, the panels thereby forming a switch matrix.

10. The textile fabric of claim 9 further comprising a surface design representing an identifier for each region of lane overlap.

11. A textile fabric having electrical functionality comprising first and second adjacent panels, each panel comprising:

a. a matrix of woven fibers, said fibers being electrically non-conductive;

b. integrated therewith, a plurality of electrically conductive fibers, said conductive fibers being arranged in a plurality of lanes each comprising a plurality of adjacent conductive fibers, adjacent lanes being separated from each other; and c. contact means, electrically connected to at least some of the lanes, for receiving an electrical connection thereto, and further wherein d. the lanes of the first panel cross the lanes of the second panel; and e. the panels are held apart to prevent inadvertent contact between overlapping lanes, compression of the panels at regions of lane overlap causing electrical contact between a lane of the first panel and a lane of the second panel, the panels thereby forming a switch matrix.

12. The textile fabric of claim 11 further comprising a surface design assigning an identifier to each region of lane overlap.

13. The textile fabric of claim 11 wherein the electrically conductive fibers are sewn into the matrix.

14. The textile fabric of claim 11 wherein the electrically conductive fibers are attached to the matrix.

15. A textile fabric having electrical functionality comprising first and second adjacent panels, each panel comprising:

a. a first series of parallel fibers, said fibers being electrically non-conductive;

b. interwoven therewith, a second series of parallel fibers, at least some of said fibers being electrically conductive, said conductive fibers being arranged in a plurality of adjacent lanes each comprising at least one conductive fiber, adjacent lanes being separated from each other by a plurality of non-conductive fibers;

c. contact means, electrically connected to at least some of the lanes, for receiving an electrical connection thereto, and further wherein d. the lanes of the first panel cross the lanes of the second panel;

e. the lanes of the first panel are resistive and are configured to receive, by means of the contact means, a voltage connected thereacross to thereby form a voltage gradient along the lanes;

f. the lanes of the first panel are configured to receive, by means of the contact means, means for measuring electrical potential; and g. the panels are held apart to prevent inadvertent contact between overlapping lanes, compression of the panels at a region of lane overlap causing electrical contact between a lane of the first panel and a lane of the second panel, the measured electrical potential indicating a compression location along the first-panel lane.

16. The textile fabric of claim 15 wherein each of the lanes of the first panel are each separately connected to the voltage source so as to facilitate, upon compression, identification of each first-panel lane with which contact is made through completion of an electrical circuit with the contacted first-panel lane.

17. A textile fabric having electrical functionality comprising first and second adjacent panels, each panel comprising:

a. a matrix of woven fibers, said fibers being electrically non-conductive;

b. integrated therewith, a plurality of electrically conductive fibers, said conductive fibers being arranged in a plurality of adjacent lanes each comprising at least one conductive fiber, adjacent lanes being separated from each other;

c. contact means, electrically connected to at least some of the lanes, for receiving an electrical connection thereto, and further wherein d. the lanes of the first panel cross the lanes of the second panel;

e. the lanes of the first panel are resistive and are configured to receive, by means of the contact means, a voltage connected thereacross to thereby form a voltage gradient along the lanes;

f. the lanes of the first panel are configured to receive, by means of the contact means, means for measuring electrical potential; and g. the panels are held apart to prevent inadvertent contact between overlapping lanes, compression of the panels at a region of lane overlap causing electrical contact between a lane of the first panel and a lane of the second panel, the measured electrical potential indicating a compression location along the first-panel lane.

18. The textile fabric of claim 17 wherein each of the lanes of the first panel are each separately connected to the voltage source so as to facilitate, upon compression, identification of each first-panel lane with which contact is made through completion of an electrical circuit with the contacted first-panel lane.

19. The textile fabric of claim 17 wherein the electrically conductive fibers are sewn into the matrix.

20. The textile fabric of claim 17 wherein the electrically conductive fibers are attached to the matrix.

21. A textile fabric having electrical functionality comprising:

a. a matrix of woven fibers, said fibers being electrically non-conductive located within said matrix;

b. integrated therewith, at least one of said electrically conductive fibers forming a passive electrical component; and c. contact means, electrically connected to the at least one conductive fiber, for receiving an electrical connection.

22. The textile fabric of claim 21 wherein the at least one electrically conductive fiber is interwoven with the matrix.

23. The textile fabric of claim 21 wherein the at least one electrically conductive fiber is attached to the matrix.

24. The textile fabric of claim 21 wherein the passive electrical component is a capacitor formed from a plurality of parallel electrically conductive fibers woven through the matrix of non-conductive fibers.

25. The textile fabric of claim 21 wherein the passive electrical component is a capacitor formed from a pair of conductive regions, each region being embroidered onto the matrix and comprising at least one electrically conductive fiber, the regions being spaced apart from each other.

26. The textile fabric of claim 25 wherein the regions are in the form of patches spaced apart from each other on the matrix.

27. The textile fabric of claim 21 wherein the textile comprises:

a. first and second adjacent panels, each panel comprising:
      i. a matrix of woven fibers, said fibers being electrically non-conductive;
      ii. integrated therewith, at least one electrically conductive region;

b. non-conductive means for separating the panels; and c. contact means, electrically connected to each patch for receiving an electrical connection, and further wherein d. the regions are aligned with each other, separated by the non-conductive separating means, so as to form a capacitor.

28. The textile fabric of claim 27 wherein the regions are in the form of embroidered patches.

29. The textile fabric of claim 27 wherein the first and second panels are in the form of concentric sleeves, the electrically conductive regions being radially aligned with each other.

30. The textile fabric of claim 21 wherein the passive electrical component is a capacitor formed from:

a. at least two electrically conductive patches having surfaces aligned with each other, one of the patches being attached to the matrix;

b. non-conductive means separating the electrically conductive patches; and c. contact means, electrically connected to each patch for receiving an electrical connection.

31. The textile fabric of claim 21 wherein the passive electrical component is an inductor formed from:

a. at least one electrically conductive spiral region integrated with the matrix; and b. contact means, electrically connected to each patch for receiving an electrical connection.

32. The textile fabric of claim 31 further comprising means for sensing magnetic coupling between the inductor and another inductor unconnected thereto.

33. The textile fabric of claim 21 wherein the textile comprises:

a. at least two adjacent panels, each panel comprising:
      i. a matrix of woven fibers, said fibers being electrically non-conductive;
      ii. integrated therewith, at least one electrically conductive spiral region;

b. means for electrically connecting the spiral regions of adjacent panels; and c. contact means, electrically connected to first and second outermost panels, for receiving an electrical connection, the spiral regions collectively forming an inductor.

34. The textile fabric of claim 21 wherein the passive electrical component is a transformer formed from:

a. at least two adjacent panels, each panel comprising:
      i. a matrix of woven fibers, said fibers being electrically non-conductive;
      ii. integrated therewith, at least one electrically conductive and magnetically permeable spiral region;

b. means for electrically connecting the spiral regions of the adjacent panels; and c. contact means, electrically connected to first and second outermost panels, for receiving an electrical connection, the spiral regions being magnetically coupled to form a transformer.

35. The textile fabric of claim 34 wherein each spirals is disposed on a face of an associated panel.

36. The textile fabric of claim 34 wherein the panels are in the form of concentric sleeves, the spiral regions of each sleeve winding circumferentially therearound.

37. The textile fabric of claim 34 wherein the spiral regions are radially aligned with each other.

38. A textile having electrical functionality, the textile fabric comprising:

a. a first series of parallel fibers, said fibers being electrically non-conductive;

b. interwoven therewith, a second series of parallel fibers, at least some of said fibers being electrically conductive, the first and second series of parallel fibers being woven perpendicularly to each other to form a matrix;

c. a plurality of electrical components located within said matrix of the textile fabric itself and electrically connected to each other through electrical connection and physical affixation to the electrically conductive fibers, the electrical components forming an electric circuit.

* * * * *